United States Patent
Li et al.

(10) Patent No.: US 11,870,457 B2
(45) Date of Patent: Jan. 9, 2024

(54) POLAR CODE ENCODING METHOD AND APPARATUS

(71) Applicant: HUAWEI TECHNOLOGIES CO., LTD., Guangdong (CN)

(72) Inventors: Bin Li, Shenzhen (CN); Jiaqi Gu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/826,540

(22) Filed: May 27, 2022

(65) Prior Publication Data

US 2022/0286144 A1 Sep. 8, 2022

Related U.S. Application Data

(63) Continuation of application No. PCT/CN2020/126836, filed on Nov. 5, 2020.

(30) Foreign Application Priority Data

Nov. 30, 2019 (CN) .......................... 201911208975.2

(51) Int. Cl.
H03M 13/07 (2006.01)
H03M 13/00 (2006.01)

(52) U.S. Cl.
CPC ......... *H03M 13/07* (2013.01); *H03M 13/611* (2013.01)

(58) Field of Classification Search
CPC ............... H03M 13/611; H03M 13/13; H03M 13/1108; H03M 13/1111; H03M 13/1148;
(Continued)

(56) References Cited

U.S. PATENT DOCUMENTS

2015/0046768 A1 2/2015 Hu et al.
2018/0183464 A1 6/2018 Ge
(Continued)

FOREIGN PATENT DOCUMENTS

CN 107612561 A 1/2018
CN 108736899 A 11/2018
(Continued)

OTHER PUBLICATIONS

Sinan Kahraman et al., Folded Tree Maximum-Likelihood Decoder for Kronecker Product-Based Codes, Fifty-first Annual Allerton Conference, Allerton House, UIUC, Illinois, USA, Oct. 2-3, 2013, 8 pages.
(Continued)

*Primary Examiner* — Thien Nguyen
(74) *Attorney, Agent, or Firm* — HUAWEI TECHNOLOGIES CO., LTD.

(57) ABSTRACT

This application discloses a polar code encoding method and apparatus, which can improve encoding performance through codeword construction. The method includes: obtaining K information bits to be encoded, where K is a positive integer; determining a first bit sequence based on the K information bits to be encoded, where a length of the first bit sequence is N, the first bit sequence includes fixed bits and the K information bits to be encoded, and the K information bits to be encoded may further include a check bit; determining a second bit sequence based on the first bit sequence and an upper triangular matrix, where the upper triangular matrix is a matrix having N rows and N columns, and the upper triangular matrix may be an upper triangular Toeplitz matrix; and performing polar code encoding on the second bit sequence to obtain and output an encoded sequence.

20 Claims, 8 Drawing Sheets

(58) Field of Classification Search
CPC ... H04L 1/0061; H04L 1/0067; H04L 1/0041; H04L 1/0057; H04L 1/0065
See application file for complete search history.

(56) References Cited

U.S. PATENT DOCUMENTS

| | | | |
|---|---|---|---|
| 2019/0081735 | A1 | 3/2019 | Chen et al. |
| 2019/0158226 | A1 | 5/2019 | Hui et al. |
| 2019/0245650 | A1* | 8/2019 | Hui .................. H03M 13/2933 |
| 2019/0296857 | A1 | 9/2019 | Gritsenko et al. |

FOREIGN PATENT DOCUMENTS

| | | |
|---|---|---|
| CN | 108880566 A | 11/2018 |
| CN | 109792255 A | 5/2019 |

OTHER PUBLICATIONS

Yifei Shen et al., Joint Detection and Decoding for Polar Coded MIMO Systems, 2017 IEEE, 6 pages.

Erdal Arikan: "From sequential decoding to channel polarization and back again", arxiv.org, Cornell University Library, 201 Olin Library Cornell University Ithaca, NY 14853, Aug. 26, 2019 (Aug. 26, 2019), XP081469646.

Bin Li et al: "A RM Polar Codes", Jul. 21, 2014 (Jul. 21, 2014) XP055270196, Retrieved from the Internet: URL:https://arxiv.org/ftp/arxiv/papers/1407/1407.5483.pdf.

Mohammad Rowshan et al: "Polarization adjusted Convolutional (PAC) Codes: Fano Decoding vs List Decoding", arxiv.org, Cornell University Library, 201 Olin Library Cornell University Ithaca, NY 14853, Feb. 17, 2020 (Feb. 17, 2020), XP081601146.

* cited by examiner

POLAR CODE ENCODING METHOD AND APPARATUS

CROSS-REFERENCE TO RELATED APPLICATIONS

This application is a continuation of International Patent Application No. PCT/CN2020/126836, filed on Nov. 5, 2020, which claims priority to Chinese Patent Application No. 201911208975.2, filed on Nov. 30, 2019. The disclosures of the aforementioned applications are hereby incorporated by reference in their entireties.

TECHNICAL FIELD

Embodiments of this application relate to the field of encoding and decoding, and in particular, to a polar code encoding method and apparatus.

BACKGROUND

A communications system usually performs channel coding to improve data transmission reliability and ensure communication quality. For example, an encoding method such as a polar code or a Reed-Muller (RM) code may be used. The polar code is a code that can achieve the Shannon capacity with low encoding and decoding complexity. The RM code was initially proposed by David Muller in 1954. A fast decoding algorithm of the RM code is very suitable for optical fiber communications systems. A code is generated by combining construction manners of the RM code and the polar code and may be referred to as an RM-polar code.

How to improve encoding performance through codeword construction is a lasting concern in the industry.

SUMMARY

Embodiments of this application provide a polar code encoding method and apparatus, to improve encoding performance.

Embodiments of this application provide the following specific technical solutions.

According to a first aspect, a polar code encoding method is provided, and an execution body of the method may be an encoding device. The encoding device may be a terminal or a network device. The method includes the following steps: obtaining K information bits to be encoded, where K is a positive integer; determining a first bit sequence based on the K information bits to be encoded, where a length of the first bit sequence is N, N is a positive integer power of 2, and the first bit sequence includes fixed bits and the K information bits to be encoded; determining a second bit sequence based on the first bit sequence and an upper triangular matrix, where the upper triangular matrix is a matrix having N rows and N columns; and performing polar code encoding on the second bit sequence to obtain and output an encoded sequence. With the construction method of adding the upper triangular matrix in the encoding process, code spectrum can be improved, and construction of the code can be optimized. Polar can theoretically prove that the channel capacity can be "achieved" when the code length tends to be infinite. However, in many practical scenarios, the code length is not infinite, and therefore the performance is limited. The method provided in embodiments of this application can help improve the performance of a polar code with a limited code length.

In a possible design, the upper triangular matrix is an upper triangular Toeplitz matrix.

In a possible design, the determining a first bit sequence based on the K information bits to be encoded may be implemented in the following manner: determining K information bit positions based on reliability sorting of N polarized channels for a polar code and a weight of each row in N rows of a generator matrix for the polar code, where the generator matrix for the polar code is a matrix having N rows and N columns, the N rows of the generator matrix for the polar code are in a one-to-one correspondence with N bit positions of the first bit sequence, and the N polarized channels are in a one-to-one correspondence with the N bit positions of the first bit sequence; and mapping the K information bits to be encoded to the K information bit positions, to obtain the first bit sequence. In the selection of the information bit positions of the polar code, comprehensively considering the reliability of the polarized channels and the row weights of the generator matrix can further increase the minimum Hamming distance of the codeword and improve the performance of the polar code. The minimum Hamming distance is the smallest distance among all mutual distances between all codewords in a codeword set formed by a construction code. In addition, due to the improvement in the encoding performance, the decoding performance can be improved to some extent.

In a possible design, the determining K information bit positions based on reliability sorting of N polarized channels for a polar code and a weight of each row in N rows of a generator matrix for the polar code may be implemented in Manner 1 or Manner 2.

Manner 1: Bit positions corresponding to polarized channels having highest reliability when sorted in descending order and rows of the generator matrix for the polar code having weights not less than a first threshold may be selected as the K information bit positions.

A first sorted sequence may be determined according to the descending order of the reliability of the N polarized channels for the polar code, and N serial numbers of the first sorted sequence are in a one-to-one correspondence with the N bit positions of the first bit sequence. Starting from the first serial number in the first sorted sequence, bit positions corresponding to K rows of the generator matrix for the polar code that have weights greater than or equal to the first threshold are selected as the K information bit positions.

Manner 2: Bit positions corresponding to rows of the generator matrix for the polar code having largest weights when sorted in descending order and polarized channels having reliability not less than a second threshold in the reliability sorting of the polarized channels are selected as the K information bit positions.

A second sorted sequence may be determined according to the descending order of the weight of each row in the N rows of the generator matrix for the polar code, and N serial numbers of the second sorted sequence are in a one-to-one correspondence with the N bit positions of the first bit sequence. Starting from the first serial number in the second sorted sequence, bit positions corresponding to K polarized channels having highest reliability when sorted in descending order are selected from the N polarized channels for the polar code, as the K information bit positions.

In a possible design, sorting according to reliability is performed after rate-matched polarized channels of the N polarized channels. Sorting according to row weights of the generator matrix is performed after rate-matched polarized channels of the N polarized channels corresponding to the N rows of the generator matrix. A rate matching method may include: puncturing, shortening, or pre-freezing.

For example, the determining K information bit positions based on reliability sorting of N polarized channels for a polar code and a weight of each row in N rows of a generator matrix for the polar code may be implemented in the following manner: determining the K information bit positions based on reliability sorting of the N polarized channels for the polar code with a polarized channel related to rate matching removed and based on a weight of each row in the N rows of the generator matrix for the polar code with a row related to rate matching removed. Optionally, the polarized channel related to rate matching includes a punctured, shortened, or pre-frozen polarized channel, and the row related to rate matching includes a row corresponding to the punctured, shortened, or pre-frozen polarized channel.

In a possible design, to determine the first bit sequence based on the K information bits to be encoded, the reliability of the polarized channels may be considered to determine the K information bit positions, for example: determining K information bit positions according to the descending order of reliability of N polarized channels for a polar code, where the N polarized channels are in a one-to-one correspondence with N bit positions of the first bit sequence; and mapping the K information bits to be encoded to the K information bit positions, to obtain the first bit sequence.

For another example, the determining K information bit positions according to the descending order of reliability of N polarized channels for a polar code may be implemented in the following manner: determining the K information bit positions according to the descending order of reliability of the N polarized channels for the polar code with a polarized channel related to rate matching removed. Optionally, the polarized channel related to rate matching includes a punctured, shortened, or pre-frozen polarized channel.

In a possible design, to determine the first bit sequence based on the K information bits to be encoded, the row weights of the generator matrix may further be considered to determine the K information bit positions, for example: determining K information bit positions based on a weight of each row in N rows of a generator matrix for a polar code, where the generator matrix for the polar code is a matrix having N rows and N columns, and the N rows of the generator matrix for the polar code are in a one-to-one correspondence with N bit positions of the first bit sequence; and mapping the K information bits to be encoded to the K information bit positions, to obtain the first bit sequence.

In a possible design, the determining K information bit positions based on a weight of each row in N rows of a generator matrix for a polar code includes: determining the K information bit positions based on a weight of each row in the N rows of the generator matrix for the polar code with a row related to rate matching removed. Optionally, the row related to rate matching includes a row corresponding to a punctured, shortened, or pre-frozen polarized channel.

In a possible design, the determining a second bit sequence based on the first bit sequence and an upper triangular matrix includes: multiplying the first bit sequence by the upper triangular matrix to obtain the second bit sequence.

In a possible design, the performing polar code encoding on the second bit sequence to obtain an encoded sequence includes: multiplying the second bit sequence by the generator matrix for the polar code to obtain the encoded sequence.

In a possible design, the information bits include check bits. When the information bits to be encoded include the check bits, a decoding device can decode by using a predetermined check relationship, thereby improving the decoding performance.

According to a second aspect, a polar code encoding apparatus is provided. The apparatus has functions of implementing the method in any one of the first aspect or the possible designs of the first aspect. The functions may be implemented by hardware, or by hardware executing corresponding software. The hardware or software includes one or more modules corresponding to the functions. In a design, the apparatus may include an obtaining unit, a determining unit, and an encoding unit. For example:

the obtaining unit is configured to obtain K information bits to be encoded, where K is a positive integer; the determining unit is configured to determine a first bit sequence based on the K information bits to be encoded, where a length of the first bit sequence is N, N is a positive integer power of 2, and the first bit sequence includes fixed bits and the K information bits to be encoded; and the encoding unit is configured to determine a second bit sequence based on the first bit sequence and an upper triangular matrix, where the upper triangular matrix is a matrix having N rows and N columns; and configured to perform polar code encoding on the second bit sequence to obtain and output an encoded sequence. With the construction method of adding the upper triangular matrix in the encoding process, code spectrum can be improved, and construction of the code can be optimized. Polar can theoretically prove that the channel capacity can be "achieved" when the code length tends to be infinite (N→∞). However, in many practical scenarios, the code length is not infinite, and therefore the performance is limited. The method provided in embodiments of this application can help improve the performance of a polar code with a limited code length.

In a possible design, the upper triangular matrix is an upper triangular Toeplitz matrix.

In a possible design, the determining unit is configured to: determine K information bit positions based on reliability sorting of N polarized channels for a polar code and a weight of each row in N rows of a generator matrix for the polar code, where the generator matrix for the polar code is a matrix having N rows and N columns, the N rows of the generator matrix for the polar code are in a one-to-one correspondence with N bit positions of the first bit sequence, and the N polarized channels are in a one-to-one correspondence with the N bit positions of the first bit sequence; and map the K information bits to be encoded to the K information bit positions, to obtain the first bit sequence. In the selection of the information bit positions of the polar code, comprehensively considering the reliability of the polarized channels and the row weights of the generator matrix can further increase the minimum Hamming distance of the codeword and improve the encoding performance of the polar code. In addition, due to the improvement in the encoding performance, the decoding performance can also be improved to some extent.

In a possible design, the determining unit is configured to: select bit positions corresponding to polarized channels having highest reliability when sorted in descending order and rows of the generator matrix for the polar code having weights not less than a first threshold, as the K information bit positions.

For example, a first sorted sequence is determined according to the descending order of the reliability of the N polarized channels for the polar code, and N serial numbers of the first sorted sequence are in a one-to-one correspondence with the N bit positions of the first bit sequence.

Starting from the first serial number in the first sorted sequence, bit positions corresponding to K rows of the generator matrix for the polar code that have weights greater than or equal to the first threshold are selected as the K information bit positions.

In a possible design, the determining unit is configured to: select bit positions corresponding to rows of the generator matrix for the polar code having largest weights when sorted in descending order and polarized channels having reliability not less than a second threshold in the reliability sorting of the polarized channels, as the K information bit positions.

For example, a second sorted sequence is determined according to the descending order of the weight of each row in the N rows of the generator matrix for the polar code, and N serial numbers of the second sorted sequence are in a one-to-one correspondence with the N bit positions of the first bit sequence. Starting from the first serial number in the second sorted sequence, bit positions corresponding to K polarized channels having highest reliability when sorted in descending order are selected from the N polarized channels for the polar code, as the K information bit positions.

In a possible design, the determining unit is configured to: determine the K information bit positions based on reliability sorting of the N polarized channels for the polar code with a polarized channel related to rate matching removed and based on a weight of each row in the N rows of the generator matrix for the polar code with a row related to rate matching removed, where the polarized channel related to rate matching includes a punctured, shortened, or pre-frozen polarized channel, and the row related to rate matching includes a row corresponding to the punctured, shortened, or pre-frozen polarized channel.

In a possible design, the determining unit is configured to: determine K information bit positions according to the descending order of reliability of N polarized channels for a polar code, where the N polarized channels are in a one-to-one correspondence with N bit positions of the first bit sequence; and map the K information bits to be encoded to the K information bit positions, to obtain the first bit sequence.

In a possible design, when determining K information bit positions according to the descending order of reliability of N polarized channels for a polar code, the determining unit is configured to: determine the K information bit positions according to the descending order of reliability of the N polarized channels for the polar code with a polarized channel related to rate matching removed. Optionally, the polarized channel related to rate matching includes a punctured, shortened, or pre-frozen polarized channel.

In a possible design, the determining unit is configured to: determine K information bit positions based on a weight of each row in N rows of a generator matrix for a polar code, where the generator matrix for the polar code is a matrix having N rows and N columns, and the N rows of the generator matrix for the polar code are in a one-to-one correspondence with N bit positions of the first bit sequence; and map the K information bits to be encoded to the K information bit positions, to obtain the first bit sequence.

In a possible design, when determining K information bit positions based on a weight of each row in N rows of a generator matrix for a polar code, the determining unit is configured to: determine the K information bit positions based on a weight of each row in the N rows of the generator matrix for the polar code with a row related to rate matching removed. Optionally, the row related to rate matching includes a row corresponding to a punctured, shortened, or pre-frozen polarized channel.

In a possible design, the encoding unit is configured to: multiply the first bit sequence by the upper triangular matrix to obtain the second bit sequence.

In a possible design, the encoding unit is configured to: multiply the second bit sequence by the generator matrix for the polar code to obtain the encoded sequence.

In a possible design, the information bits include check bits. When the information bits to be encoded include the check bits, a decoding device can decode by using a predetermined check relationship, thereby improving the decoding performance.

According to a third aspect, a polar code encoding apparatus is provided. The apparatus has functions of implementing the method in any one of the first aspect or the possible designs of the first aspect. The functions may be implemented by hardware, or by hardware executing corresponding software. The hardware or software includes one or more modules corresponding to the functions.

In a possible design, when some or all of the functions are implemented by hardware, the polar code encoding apparatus includes: an input interface circuit, configured to obtain K information bits to be encoded, where K is a positive integer; a logic circuit, configured to perform the actions (except obtaining the K information bits to be encoded and outputting the encoded sequence) described in any one of the first aspect or the possible designs of the first aspect; and an output interface circuit, configured to output the encoded sequence.

Optionally, the polar code encoding apparatus may be a chip or an integrated circuit.

In a possible design, when some or all of the functions are implemented by software, the polar code encoding apparatus includes: a memory, configured to store a program; and a processor, configured to execute the program stored in the memory. When the program is executed, the polar code encoding apparatus may implement the method in any one of the first aspect or the possible designs of the first aspect.

Optionally, the memory may be a physically independent unit, or may be integrated with the processor.

In a possible design, when some or all of the functions are implemented by software, the polar code encoding apparatus includes a processor. A memory configured to store a program is located outside the encoding apparatus. The processor is connected to the memory via a circuit/wire, and is configured to read and execute the program stored in the memory.

According to a fourth aspect, a computer-readable storage medium is provided that stores computer-readable instructions that, when executed on a computer, cause the computer to perform the method in any one of the first aspect or the possible designs of the first aspect.

According to a fifth aspect, an embodiment of this application provides a computer program product including instructions that, when executed on a computer, cause the computer to perform the method according to any one of the first aspect or the possible designs of the first aspect.

According to a sixth aspect, an embodiment of this application provides a chip system. The chip system includes a processor, and may further include a memory, configured to implement the method according to any one of the first aspect or the possible designs of the first aspect. The chip system may include a chip, or may include the chip and another discrete component.

DESCRIPTION OF EMBODIMENTS

Embodiments of this application provide a polar code encoding method and apparatus. The method and the apparatus are based on a same technical concept. Because a problem-resolving principle of the method is similar to that of the apparatus, mutual reference may be made to implementations of the apparatus and the method, and details of the same parts are not repeated. In the description of embodiments of this application, the term "and/or" describes an association relationship between associated objects and indicates that three relationships may exist. For example, A and/or B may indicate the following three cases: Only A exists, both A and B exist, and only B exists. The character "/" generally indicates an "or" relationship between the associated objects. In this application, "at least one" means one or more, and "a plurality of" means two or more. In addition, it should be understood that, in the description of this application, the terms such as "first", "second", and "third" are merely used for distinguishing and description, but cannot be understood as an indication or implication of relative importance or an indication or implication of an order.

The decoding method provided in embodiments of this application may be applied to a fifth-generation (5G) communications system, such as 5G new radio (NR) system or a device-to-device (D2D) communications system, or may be applied to various future communications systems.

The following describes in detail embodiments of this application with reference to the accompanying drawings.

Figure 1:
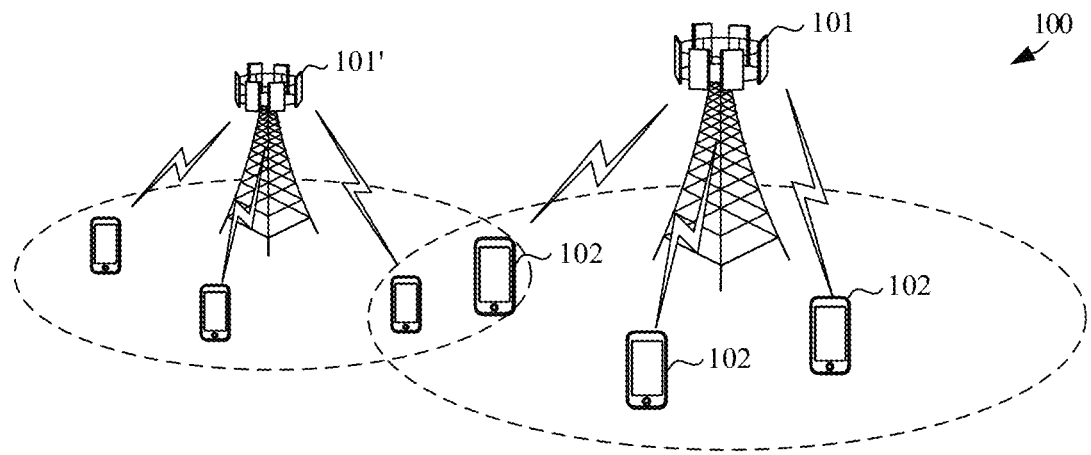
FIG. 1 is a schematic diagram of an architecture of a communications system according to an embodiment of this application.

FIG. 1 shows an architecture of a possible communications system to which the decoding method provided in embodiments of this application is applicable. As shown in FIG. 1, the communications system 100 includes a network device 101 and one or more terminals 102. When the communications system 100 includes a core network, the network device 101 may be further connected to the core network. The network device 101 provides a service for a terminal 102 within its coverage area. For example, refer to FIG. 1. The network device 101 provides wireless access for the one or more terminals 102 covered by the network device 101. In addition, there may be an overlapping area between coverage areas of network devices, such as the network device 101 and a network device 101'. The network devices may further communicate with each other. For example, the network device 101 may communicate with the network device 101'.

The network device 101 is a node in a radio access network (RAN), and may also be referred to as a base station or a RAN node (or device). Currently, some examples of the network device 101 are: a next-generation NodeB gNB), a next-generation evolved NodeB (Ng-eNB), a transmission reception point (TRP), an evolved Node B (eNB), a radio network controller (RNC), a Node B (NB), a base station controller (BSC), a base transceiver station (BTS), a home base station (for example, a home evolved NodeB, or a home Node B, HNB), a baseband unit (BBU), or a wireless fidelity (Wi-Fi) access point (AP). The network device 101 may also be a satellite, and the satellite may also be referred to as a high-altitude platform, a high-altitude aircraft, or a satellite base station. The network device 101 may also be another device having a network device function. For example, the network device 101 may also be a device that functions as a network device in D2D communications. The network device 101 may also be a network device in a possible future communications system.

In some deployments, the network device may include a centralized unit (CU) and a distributed unit (DU). The network device may further include an active antenna unit (AAU). The CU implements some functions of the network device, and the DU implements some other functions of the network device. For example, the CU is responsible for processing a non-real-time protocol and service, and implements functions of a radio resource control (RRC) layer and a packet data convergence protocol (PDCP) layer. The DU is responsible for processing a physical layer protocol and a real-time service, and implements functions of a radio link control (RLC) layer, a media access control (MAC) layer, and a physical (PHY) layer. The AAU implements some physical layer processing functions, radio frequency processing, and a function related to an active antenna. Information at the RRC layer is eventually converted into information at the PHY layer, or is converted from information at the PHY layer. Therefore, in this architecture, higher layer signaling such as RRC layer signaling may also be considered as being sent by the DU or sent by the DU and the AAU. It may be understood that the network device may be a device including one or more of a CU node, a DU node, and an AAU node. In addition, the CU may be classified into a network device in an access network (RAN), or may be classified into a network device in a core network (CN). This is not limited in this application.

The terminal 102 is also referred to as user equipment (UE), a mobile station (MS), a mobile terminal (MT), or the like, and is a device that provides a user with voice and/or data connectivity. For example, the terminal 102 includes a handheld device or a vehicle-mounted device that has a wireless connection function. Currently, the terminal 102 may be a mobile phone, a tablet computer, a notebook computer, a palmtop computer, a mobile Internet device (MID), a wearable device (such as a smart watch, a smart band, or a pedometer), a vehicle-mounted device (such as an automobile, a bicycle, an electric vehicle, an aircraft, a ship, a train, or a high-speed train), a virtual reality (VR) device, an augmented reality (AR) device, a wireless terminal in industrial control, a smart home device (such as a refrigerator, a television, an air conditioner, or an electricity meter), an intelligent robot, a workshop device, a wireless terminal in self driving, a wireless terminal in remote medical surgery, a wireless terminal in a smart grid, a wireless terminal in transportation safety, a wireless terminal in a smart city, a wireless terminal in a smart home, a flight device (such as an intelligent robot, a hot balloon, an unmanned aerial vehicle, or an aircraft), or the like. The terminal 102 may also be another device having a terminal function. For example, the terminal 102 may also be a terminal that functions as a terminal in D2D communications.

Based on the architecture of the communications system shown in FIG. 1, the following describes in detail a polar code encoding method provided in an embodiment of this application. An execution body of the polar code encoding method may be an encoding device, and the encoding device may be the network device 101 or the terminal 102. The encoding device encodes information bits to be encoded, and obtains and sends an encoded codeword to a decoding device. The encoding device may also be referred to as a transmitter, and the decoding device is a receiver. When the transmitter or the encoding device is the network device 101, the receiver or the decoding device is the terminal 102. When the transmitter or the encoding device is the terminal 102, the receiver or the decoding device is the network device 101.

First, possible implementations of several encoding methods are introduced.

Encoding method 1: encoding of a conventional polar code.

A polar code is also a linear block code. A generator matrix is $G_N$, which may also be denoted as G. The generator matrix may also be referred to as a coding matrix. An encoding process is $x_1^N = u_1^N G_N$, where $u_1^N = (u_1, u_2, \ldots, u_N)$ is a binary row vector of length N, and N is a code length of the polar code; and $G_N$ is an N×N matrix, and $G_N = F_2^{\otimes(\log_2(N))} \cdot F_2^{\otimes(\log_2(N))}$ is defined as a Kronecker product of $\log_2 N$ matrices $F_2$. The matrix $$F_2 = \begin{bmatrix} 1 & 0 \\ 1 & 1 \end{bmatrix}.$$

In the encoding process of the polar code, one part of the bits in $u_1^N$ is used to carry information, the bits carrying information are referred to as information bits, this part of bits used to carry information forms an information bit set, and a set of indexes of these bits is denoted as A; the other part of the bits is set to fixed values pre-agreed by a receiver and a transmitter, and is referred to as a set of fixed bits or frozen bits (frozen bits), and a set of indexes of these bits is denoted by the complement $A^c$ of A. The encoding process of the polar code is equivalent to $x_1^N = u_A G_N(A) \oplus u_{A^c} G_N(A^C)$, where $G_N(A)$ is a submatrix obtained from rows of $G_N$ that correspond to the indexes in the set A, and $G_N(AC)$ is a submatrix obtained from rows of $G_N$ that correspond to the indexes in the set $A^c$. $u_A$ is the set of information bits in $u_1^N$, and a quantity of the information bits is K. $u_{A^c}$ is the set of fixed bits in $u_1^N$, and a quantity of the fixed bits is (N−K), which are known bits. These fixed bits are usually set to 0, but the fixed bits may be set to any value provided that the value is pre-agreed by the receiver and the transmitter. Then, an encoded output of the polar code may be reduced to $x_1^N = u_A G_N(A)$, where $u_A$ is the set of information bits in $u_1^N$, $u_A$ is a row vector of length K, that is, |A|=K, |•| represents a quantity of elements in the set, K is an information block size or the quantity of the information bits or a size of the set of information bits, and $G_N(A)$ is a submatrix obtained from rows of the matrix $G_N$ that correspond to the indexes in the set A, and is a K×N matrix.

A construction process of the polar code is a selection process of the set A. This determines performance of the polar code. The construction process of the polar code is usually as follows: The presence of N polarized channels in total is determined based on the mother code length N, and the N polarized channels correspond to the N rows of the generator matrix, respectively. Reliability of the polarized channels is calculated. Indexes of K polarized channels having highest reliability are used as elements of the set A, and indexes corresponding to the remaining (N−K) polarized channels are used as elements of the set $A^c$ of the indexes of the fixed bits. The set A determines positions of the information bits, and the set $A^c$ determines positions of the fixed bits.

Figure 2:
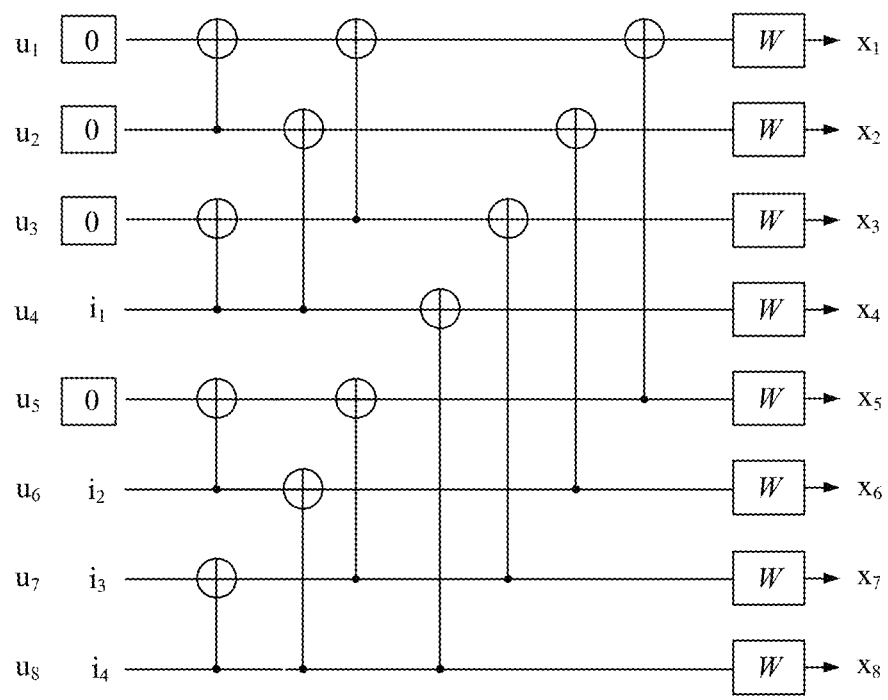
FIG. 2 is a first schematic diagram of a polar code encoding method according to an embodiment of this application.

As shown in FIG. 2, an 8×8 generator matrix is illustrated, where a vector u is represented by (0, 0, 0, $U_4$, 0, $U_6$, $U_7$, $U_8$), and bits encoded through the generator matrix are represented by a vector ($X_1$, $X_2$, $X_3$, $X_4$, $X_5$, $X_6$, $X_7$, $X_8$). Bit positions corresponding to high-reliability channels are used for mapping of information bits, and bit positions corresponding to low-reliability channels are used for mapping of fixed bits. As shown in FIG. 2, $\{u_1, u_2, u_3, u_5\}$ are positions of fixed bits, and $\{u_4, u_6, u_7, u_8\}$ are positions of information bits. An information vector $\{i_1, i_2, i_3, i_4\}$ of length 4 that is to be encoded is mapped to the positions of the information bits, and 8 encoded bits are generated after encoding. After the encoding, an encoded sequence is modulated, then passes through a noisy channel, and then is output.

It is assumed that the generator matrix G is $$G = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

Then the encoded bits X may be obtained based on X=uG.

$$X = uG = \begin{bmatrix} 0 \\ 0 \\ 0 \\ u_4 \\ 0 \\ u_6 \\ u_7 \\ u_8 \end{bmatrix}^T \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

where u is a 1×8 row vector, and the row vector is represented by the transpose of an 8×1 column vector in the formula representation.

Encoding method 2: encoding of an RM code.

Given parameters r and m, where r≤m, an RM code of order r is present and may be denoted as (r, m). An RM codeword has a code length of $N=2^m$ and a minimum code distance of $d=2^{m-r}$, and a quantity of information bits is $$K = \sum_{i=0}^{r} \binom{m}{i}.$$

Therefore, the RM code may also be denoted as (N, K, d).

The RM code may be constructed by using the same generator matrix G as that for the polar code, that is, constructed by using the N×N generator matrix $$G = \begin{bmatrix} 1 & 0 \\ 1 & 1 \end{bmatrix}^{\otimes n}.$$

However, a different method is used to select information bit positions. In the construction of the RM code, a weight of a row of the G matrix corresponding to each bit position is determined, and K bit positions are selected as the information bit positions according to the row weights in descending order. The remaining bit positions corresponding to small row weights are used as fixed bit positions. The fixed bit positions are usually set to 0. A quantity of non-"0" elements in a row of the generator matrix is referred to as a Hamming weight of the row or a weight of the row or simply a row weight.

For example, the generator matrix G is:

$$G = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

In the generator matrix G, row weights of the first to the fourth row are 1, 2, 2, and 4, respectively.

Assuming that K=1, that is, to select one information bit position, a bit position corresponding to the fourth row having the largest row weight may be selected as the information bit position.

Assuming that K=2, that is, to select two information bit positions, bit positions corresponding to two rows having largest row weights when sorted in descending order may be selected as the information bit positions. A row having the largest row weight is the fourth row, and a bit position corresponding to the fourth row having the largest row weight is one of the information bit positions. Row weights of the second row and the third row are the same. To determine the other of the bit positions, a bit position corresponding to either of the second row and the third row may be selected as the information bit position, or the bit position may be selected sequentially according to the natural order, or the bit position may be determined according to a row closest to the row corresponding to the largest row weight. If the other bit position is determined by selecting sequentially according to the natural order, the second row is selected, and such a manner is relatively simple for an encoder. If the information bit position is determined according to the row closest to the row corresponding to the largest row weight, for example, the row having the largest row weight is the fourth row, the third row is then selected from the second row and the third row. In this manner, data is more concentrated and more conducive to decoding.

For another example, the generator matrix G is $$G = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

In the generator matrix G, row weights of the first to the eighth row are 1, 2, 2, 4, 2, 4, 4, and 8, respectively. The eighth row has the largest row weight, the fourth, sixth, and seventh rows the second largest row weight, the second, third, and fifth rows the third largest row weight, and the first row the smallest row weight. The rows are 8, (4, 6, 7), (2, 3, 5), and 1 when the row weights are sorted in descending order.

Assuming that K=4, that is, to select four information bit positions, bit positions corresponding to the eighth, fourth, sixth, and seventh rows when the row weights sorted in descending order may be selected as the information bit positions.

Assuming that K=6, that is, to select six information bit positions, bit positions corresponding to the eighth, fourth, sixth, and seventh rows when the row weights sorted in descending order may be first selected as four of the information bit positions. Two more information bit positions need to be selected. There are three rows having the third largest row weight, and bit positions corresponding to any two of the second, third, and fifth rows may be selected as the information bit positions, or bit positions corresponding to two rows may be selected sequentially according to the natural order as the information bit positions, or the information bit positions may be determined according to two rows closest to the row corresponding to the largest row weight. If the bit positions corresponding to the two rows are selected sequentially according to the natural order as the information bit positions, the second and third rows may be selected, and such a manner is relatively simple for an encoder. If the information bit positions are determined according to the two rows closest to the row corresponding to the largest row weight, for example, the row having the largest row weight is the eighth row, the third and fifth rows are then selected from the second, third, and fifth rows. In this manner, data is more concentrated and more conducive to decoding.

Encoding method 3: encoding of an RM-polar code.

A construction procedure of the RM-polar code is as follows: An N×N generator matrix G is obtained, where $$G = \begin{bmatrix} 1 & 0 \\ 1 & 1 \end{bmatrix}^{\otimes n}.$$

N rows of the generator matrix G are in a one-to-one correspondence with N bit positions. The N bit positions are in a one-to-one correspondence with N polarized channels. K information bit positions are determined according to sorting of reliability of the N polarized channels and a row weight of the generator matrix corresponding to each bit position. The K information bit positions are determined according to the descending order of the reliability of the N polarized channels and the descending order of row weights of the generator matrix. The reliability of the polarized channels may be sorted according to the ascending order of Bhattacharyya parameters, or according to the descending order of channel capacities, or according to normalized reliability or equivalent reliability of the polarized channels.

In a first possible implementation, the K information bit positions are determined by using the descending order of the reliability of the N polarized channels as a primary reference factor, and the descending order of the row weights of the generator matrix as a secondary reference factor.

Bit positions corresponding to polarized channels having highest reliability when sorted in descending order and rows of the generator matrix for the polar code having weights not less than a first threshold may be selected as the K information bit positions. In other words, bit positions corresponding to polarized channels having highest reliability in the reliability sorting of the polarized channels and rows having weights not less than the first threshold may be selected as the information bit positions. The remaining bit positions are used as fixed bit positions.

K information bit positions corresponding to K polarized channels may be selected according to the descending order of the reliability of the N polarized channels; it is determined whether row weights of K rows of the generator matrix that correspond to the K information bit positions are all greater than or equal to the first threshold; and if yes, the K information bit positions are determined. Otherwise, the K information bit positions are determined according to the following process. If row weights of K1 rows in the K rows of the generator matrix that correspond to the selected K information bit positions are less than the first threshold, K1 information bit positions corresponding to the K1 rows are then removed from the selected K information bit positions, that is, (K−K1) information bit positions may be determined. In addition, (N−K) polarized channels in the N polarized channels other than the selected K polarized channels are sorted according to the descending order of reliability of the (N−K) polarized channels, to select K1 information bit positions corresponding to K1 polarized channels and determine whether row weights of K1 rows of the generator matrix that correspond to the K1 information bit positions are all greater than or equal to the first threshold, and if yes, the K1 information bit positions and the determined (K−K1) information bit positions are determined as the K information bit positions; otherwise, that is, if row weights of K2 rows in the K1 rows of the generator matrix that correspond to the selected K1 information bit positions are less than the first threshold, K2 information bit positions corresponding to the K2 rows are then removed from the selected K1 information bit positions, that is, (K−K2) information bit positions may be determined. In addition, (N−K−K1) polarized channels in the N polarized channels other than the selected (K+K1) polarized channels are sorted according to the descending order of reliability of the (N−K−K1) polarized channels, to select K2 information bit positions corresponding to K2 polarized channels and determine whether row weights of K2 rows of the generator matrix that correspond to the K2 information bit positions are all greater than or equal to the first threshold, and if yes, the K2 information bit positions and the determined (K−K2) information bit positions are determined as the K information bit positions; otherwise, operations similar to those described above are performed until the K information bit positions are selected.

The polarized channels may be selected successively according to the descending order of reliability of the N polarized channels, and each time a polarized channel is selected, it is determined whether a row weight of a row of the generator matrix that corresponds to the polarized channel is greater than or equal to the first threshold. If yes, a bit position corresponding to the polarized channel is determined as an information bit position; otherwise, the bit position corresponding to the polarized channel is determined as a fixed bit position. Then, a next polarized channel continues to be selected, and the same method is used to determine whether a bit position corresponding to the polarized channel is a fixed bit position or an information bit position, until the K information bit positions are determined, and the remaining undetermined bit positions are determined as fixed bit positions.

Figure 3:
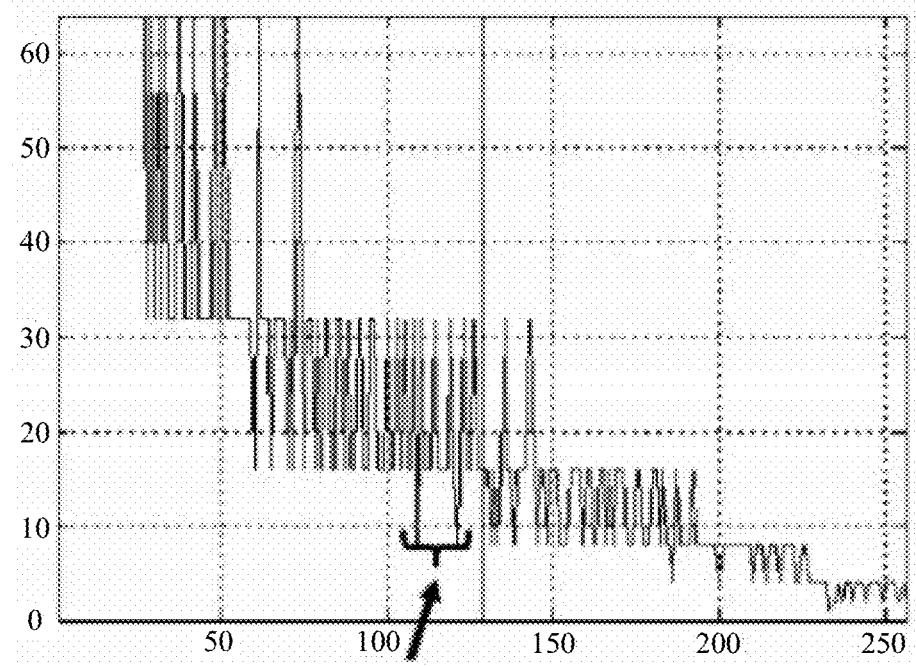
FIG. 3 is a schematic diagram of a method for constructing a (256, 128) RM-polar code according to an embodiment of this application.

FIG. 3 shows a (256, 128) RM-polar code, that is, a code length of the RM-polar code is 256, and a length of an information bit sequence is 128. The horizontal axis represents a serial number of a sorted sequence obtained according to the descending order of reliability. The serial number of the sorted sequence corresponds to a serial number of a polarized channel of the polar code and also corresponds to a bit position. The vertical axis represents a row weight of each row of the generator matrix. The left side of the solid vertical line in the middle represents 128 bit positions corresponding to polarized channels having relatively high reliability, and the right side thereof represents 128 bit positions corresponding to channels having relatively low reliability. If K information bit positions are determined according to the reliability of the polarized channels, the 128 bit positions on the left side of the solid vertical line may be selected. When selecting the information bit positions is also based on a row weight, it is further required to determine whether the row weight is not less than a threshold. Assuming that the specified threshold is 16, it can be seen from FIG. 3 that two bit positions near the left side of the solid vertical line correspond to row weights less than 16. Therefore, the two bit positions are not to be selected as the information bit positions of the RM-polar code, and two bit positions closest to the right side of the solid vertical line and corresponding to row weights greater than or equal to 16 may be selected as the two information bit positions in place of the two bit positions corresponding to row weights less than 16.

In a second possible implementation, the K information bit positions are determined by using the descending order of the row weights of the generator matrix as a primary reference factor, and the descending order of the reliability of the N polarized channels as a secondary reference factor.

Bit positions corresponding to rows of the generator matrix for the polar code having largest weights when sorted in descending order and polarized channels having reliability not less than a second threshold in the reliability sorting of the polarized channels are selected as the K information bit positions. In other words, bit positions corresponding to rows of the generator matrix having largest weights in the row weight sorting and polarized channels having reliability not less than a second threshold in the reliability sorting are selected as the K information bit positions, and the remaining bit positions are fixed bit positions.

K information bit positions corresponding to K rows may be selected according to the descending order of the row weights of the N rows of the generator matrix. It is assumed that (K−K0) information bit positions have been selected, and in selection of the (K−K0+1)$^{th}$ to the K$^{th}$ information bit position according to the row weight sorting, row weights of X rows (X>K0) more than K0 rows are the same. Then, the first K0 rows corresponding to the polarized channels having reliability sorted in descending order may be selected from the X rows, and bit positions corresponding to the K0 rows are used as the $(K-K0+1)^{th}$ to the $K^{th}$ information bit position. For example, it is assumed that (K−1) information bit positions have been selected, and in selection of the $K^{th}$ information bit position according to the row weight sorting, row weights of a plurality of rows are the same. Then, a row corresponding to a polarized channel having the highest reliability may be selected from the plurality of rows, and a bit position corresponding to the row is used as the $K^{th}$ information bit position. Similarly, it is assumed that (K−2) information bit positions have been selected, and in selection of the $(K-1)^{th}$ and the $K^{th}$ information bit position according to the row weight sorting, row weights of a plurality of rows more than two rows are the same. Then, rows corresponding to polarized channels having the highest and the second highest reliability may be selected from the plurality of rows, and bit positions corresponding to the two rows are used as the $(K-1)^{th}$ and the $K^{th}$ information bit position. The rest can be deduced by analogy.

The generator matrix G is $$G = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

In the generator matrix G, row weights of the first to the eighth row are 1, 2, 2, 4, 2, 4, 4, and 8, respectively. The eighth row has the largest row weight, the fourth, sixth, and seventh rows the second largest row weight, the second, third, and fifth rows the third largest row weight, and the first row the smallest row weight. The rows are 8, (4, 6, 7), (2, 3, 5), and 1 when the row weights are sorted in descending order.

Assuming that K=6, that is, to select six information bit positions, bit positions corresponding to the eighth, fourth, sixth, and seventh rows when the row weights sorted in descending order may be first selected as four of the information bit positions. Two more information bit positions need to be selected. Bit positions corresponding to two rows having the highest and second highest reliability may be selected according to the sorting of reliability of polarized channels corresponding to the rows (2, 3, and 5) and used as the information bit positions.

In another possible implementation, bit positions corresponding to rows of the generator matrix having largest weights and polarized channels having reliability not less than a second threshold in the reliability sorting are selected as information bit positions, and the remaining bit positions are used as fixed bit positions.

Polar can theoretically prove that the channel capacity can be "achieved" when the code length tends to be infinite (N→∞). However, in many practical scenarios, the code length is not infinite, and therefore the performance is limited. The method provided in embodiments of this application can help improve the performance of a polar code with a limited code length.

Figure 4:
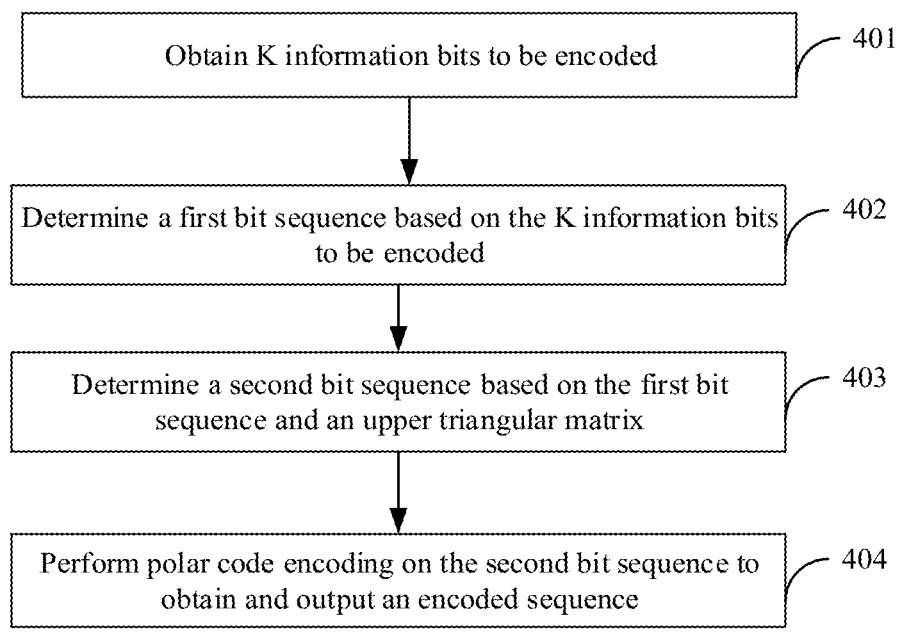
FIG. 4 is a second schematic diagram of a polar code encoding method according to an embodiment of this application.

As shown in FIG. 4, specific procedures of a polar code encoding method provided in an embodiment of this application are as follows.

S401: Obtain K information bits to be encoded.

K is a positive integer. For example, K=1, 2, 3, . . . .

S402: Determine a first bit sequence based on the K information bits to be encoded.

A length of the first bit sequence is N, N is a positive integer power of 2, and the first bit sequence includes fixed bits and the K information bits to be encoded. The K information bits to be encoded may be briefly referred to as K information bits.

N may be a mother code length of a polar code. K is less than or equal to N. When the first bit sequence is determined based on the K information bits, K information bit positions may be first determined, where the information bit positions are positions in the sequence of length N that are used for placing or mapping the information bits. The remaining positions in the sequence of length N other than the positions for placing the information bits are fixed bit positions, that is, positions for placing or mapping fixed bits. The fixed bits are usually zeros. The first bit sequence may be obtained by mapping the K information bits to the K information bit positions, or placing the K information bits in the K information bit positions in the sequence of length N, and setting the remaining positions to the fixed bits. The sequence of length N is used to represent N bit positions. For example, N=8, and K=4. (K=4) information bits are $\{i_1, i_2, i_3, i_4\}$, and the sequence of length N includes 8 bits, where $\{u_1, u_2, u_3, u_5\}$ are positions of fixed bits, and $\{u_4, u_6, u_7, u_8\}$ are positions of the information bits. Then the sequence of length N is (0, 0, 0, $U_4$, 0, $U_6$, $U_7$, $U_8$). The first bit sequence is (0, 0, 0, $i_1$, 0, $i_2$, $i_3$, $i_4$). Alternatively, the first bit sequence may be represented by the sequence of length N (0, 0, 0, $U_4$, 0, $U_6$, $U_7$, $U_8$), indicating that the fourth, sixth, seventh, and eighth positions are the information bit positions for placing the information bits, and that the remaining bits are for placing the fixed bits.

S403: Determine a second bit sequence based on the first bit sequence and an upper triangular matrix.

The upper triangular matrix is a matrix having N rows and N columns. The upper triangular matrix may be any upper triangular matrix.

The first bit sequence is a vector of size N, including information bits and fixed bits. Optionally, the first bit sequence may be multiplied by the upper triangular matrix to obtain the second bit sequence. A length of the second bit sequence is N.

S404: Perform polar code encoding on the second bit sequence to obtain and output an encoded sequence.

For example, the second bit sequence may be multiplied by a generator matrix to obtain and output the encoded sequence, thereby completing the encoding process. The length of the second bit sequence is N, a size of the generator matrix is N×N, and a length of the encoded sequence is N.

The following uses an example to describe a process of determining the second bit sequence based on the first bit sequence and the upper triangular matrix, and obtaining the encoded sequence based on the second bit sequence. The first bit sequence may be represented by V, the second bit sequence by U, and the upper triangular matrix by T. If the second bit sequence is a product of the first bit sequence and the upper triangular matrix, it is expressed as U=VT. The encoded sequence is represented by X. If X is obtained by multiplying the second bit sequence by the generator matrix G, it is expressed as X=UG. By substituting U=VT, there is X=VTG.

Refer the example of S402. N=8, K=4, and the first bit sequence V=(0, 0, 0, $U_4$, 0, $U_6$, $U_7$, $U_8$) are still used as an example. The generator matrix G is $$G = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

The upper triangular matrix T may be any upper triangular matrix. For example, $$T = \begin{bmatrix} 1 & 0 & 1 & 0 & 1 & 0 & 0 & 0 \\ 0 & 1 & 0 & 0 & 1 & 0 & 1 & 0 \\ 0 & 0 & 1 & 1 & 0 & 0 & 0 & 1 \\ 0 & 0 & 0 & 1 & 0 & 1 & 0 & 1 \\ 0 & 0 & 0 & 0 & 1 & 1 & 1 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}.$$

$$X = VTG = \begin{bmatrix} 0 \\ 0 \\ 0 \\ u_4 \\ 0 \\ u_6 \\ u_7 \\ u_8 \end{bmatrix}^T \begin{bmatrix} 1 & 0 & 1 & 0 & 1 & 0 & 0 & 0 \\ 0 & 1 & 0 & 0 & 1 & 0 & 1 & 0 \\ 0 & 0 & 1 & 1 & 0 & 0 & 0 & 1 \\ 0 & 0 & 0 & 1 & 0 & 1 & 0 & 1 \\ 0 & 0 & 0 & 0 & 1 & 1 & 1 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix} \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix},$$

where V is a 1×8 row vector, and the row vector is represented by the transpose of an 8×1 column vector in the formula representation.

The upper triangular matrix T may also be an upper triangular Toeplitz matrix. Usually, the Toeplitz matrix may also be referred to as a convolution operation matrix.

The following gives an example of the upper triangular Toeplitz matrix.

$$T = \begin{bmatrix} 1 & 0 & 1 & 0 & 0 & 0 & 0 & 0 \\ 0 & 1 & 0 & 1 & 0 & 0 & 0 & 0 \\ 0 & 0 & 1 & 0 & 1 & 0 & 0 & 0 \\ 0 & 0 & 0 & 1 & 0 & 1 & 0 & 0 \\ 0 & 0 & 0 & 0 & 1 & 0 & 1 & 0 \\ 0 & 0 & 0 & 0 & 0 & 1 & 0 & 1 \\ 0 & 0 & 0 & 0 & 0 & 0 & 1 & 0 \\ 0 & 0 & 0 & 0 & 0 & 0 & 0 & 1 \end{bmatrix}.$$

This example of the upper triangular Toeplitz matrix has the following characteristics: row i+1 is obtained by shifting row i to the right by one position, and elements on the diagonal are the same, where i=0, 1, 2, . . . , (N−1) or i=1, 2, . . . , N.

Then the encoded sequence $$X = VTG = \begin{bmatrix} 0 \\ 0 \\ 0 \\ u_4 \\ 0 \\ u_6 \\ u_7 \\ u_8 \end{bmatrix}^T \begin{bmatrix} 1 & 0 & 1 & 0 & 0 & 0 & 0 & 0 \\ 0 & 1 & 0 & 1 & 0 & 0 & 0 & 0 \\ 0 & 0 & 1 & 0 & 1 & 0 & 0 & 0 \\ 0 & 0 & 0 & 1 & 0 & 1 & 0 & 0 \\ 0 & 0 & 0 & 0 & 1 & 0 & 1 & 0 \\ 0 & 0 & 0 & 0 & 0 & 1 & 0 & 1 \\ 0 & 0 & 0 & 0 & 0 & 0 & 1 & 0 \\ 0 & 0 & 0 & 0 & 0 & 0 & 0 & 1 \end{bmatrix} \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

With the construction method of adding the upper triangular matrix in the encoding process, that is, compared with an existing construction method of a codeword, in this embodiment of this application, the upper triangular matrix T is added between V and G, which can improve code spectrum, optimize construction of the code, and further improve the performance of the polar code with the limited code length.

In this embodiment of this application, the first bit sequence includes K information bits and (N−K) fixed bits. To determine the first bit sequence, it is required to determine positions of the K information bits and map the K information bits to be encoded to the K information bit positions, thereby obtaining the first bit sequence. After the K information bits are mapped to the K information bit positions, the remaining positions are necessarily fixed bit positions for placing the fixed bits. In other words, to determine the first bit sequence, it is required to determine (N−K) positions other than the K information bit positions as fixed bit positions, and map the (N−K) fixed bits to the (N−K) fixed bit positions.

This embodiment of this application may provide some possible implementations of how to determine the K information bit positions to determine the first bit sequence.

A sequence of length N represents N bit positions, including information bit positions and fixed bit positions. The information bit positions in the N bit positions determine which positions in the first bit sequence are used for placing information bits; and the fixed bit positions in the N bit positions determine which positions in the first bit sequence are used for placing fixed bits. N polarized channels for a polar code are in a one-to-one correspondence with the N bit positions. When reliability of a polarized channel is higher, it indicates that a bit position corresponding to the polarized channel is more suitable to be used as an information bit position. N rows of a generator matrix for the polar code are in a one-to-one correspondence with the N bit positions. When a row of the generator matrix for the polar code has a larger row weight, it indicates that a bit position corresponding to the row is more suitable to be used as an information bit position.

Implementation 1: The K information bit positions are determined based on reliability sorting of the N polarized channels for the polar code and a weight of each row in the N rows of the generator matrix for the polar code.

For the method for determining the K information bit positions in Implementation 1, refer to the method for determining the K information bit positions in foregoing encoding method 3.

In Implementation 1, both the reliability sorting of the N polarized channels for the polar code and the weight of each row in the N rows of the generator matrix for the polar code need to be taken into account to determine the K information bit positions. The K information bit positions may be determined by using the descending order of the reliability of the N polarized channels as a primary reference factor, and the descending order of the row weights of the generator matrix as a secondary reference factor. Alternatively, the K information bit positions may be determined by using the descending order of the row weights of the generator matrix as a primary reference factor, and the descending order of the reliability of the N polarized channels as a secondary reference factor.

Positions in the N bit positions other than the K information bit positions are fixed bit positions. The K information bits are mapped to the selected K information bit positions, and the remaining positions are zeros. Alternatively, the K information bits are mapped to the selected K information bit positions, the remaining positions are set to zeros, and the fixed bits are mapped to the fixed bit positions. In this way, the first bit sequence is determined.

Implementation 2: The K information bit positions are determined according to the descending order of the reliability of the N polarized channels for the polar code.

In Implementation 2, the K information bit positions are determined by considering the reliability sorting of the polarized channels, without considering the row weights of the generator matrix for the polar code. The N polarized channels for the polar code are in a one-to-one correspondence with the N bit positions. When reliability of a polarized channel is higher, a bit position corresponding to the polarized channel is more suitable to be selected as an information bit position. K polarized channels having highest reliability may be selected according to the descending order of the reliability of the N polarized channels, to determine K information bit positions corresponding to the K polarized channels.

Implementation 3: The K information bit positions are determined based on a weight of each row in the N rows of the generator matrix for the polar code.

For the method for determining the K information bit positions in Implementation 3, refer to the method for determining the K information bit positions in foregoing encoding method 2.

In Implementation 3, the K information bit positions are determined by considering the row weights of the N rows, without considering the reliability sorting of the N polarized channels. The N rows of the generator matrix for the polar code are in a one-to-one correspondence with the N bit positions. When a row of the generator matrix has a larger row weight, a bit position corresponding to the row is more suitable to be selected as an information bit position. K polarized channels may be selected according to the descending order of the row weights of the N rows of the generator matrix, to determine K information bit positions corresponding to the K polarized channels.

In this embodiment of this application, there may be other methods for determining the first bit sequence or for determining the K information bit positions, and no limitation is imposed thereto.

In this embodiment of this application, the information bits to be encoded may include a check bit. For example, the K information bits to be encoded include K1 first information bits and K2 check bits. The encoding device first obtains K1 information bits and performs check encoding on the K1 information bits, to obtain K2 check bits. A check encoding method in this embodiment of this application may be cyclic redundancy check (CRC) encoding, or parity check (PC) encoding, or a check encoding method combining CRC and PC. For example, CRC encoding is performed on the K1 first information bits to obtain K2 CRC check bits. For another example, PC encoding, for example, may be performed on the K1 first information bits to obtain K2 PC check bits. For another example, CRC encoding and then PC encoding, for example, may be performed on the K1 first information bits to obtain K2 check bits. For another example, PC encoding and then CRC encoding, for example, may be performed on the K1 first information bits to obtain K2 check bits. When the information bits to be encoded include the check bits, a decoding device can decode by using a predetermined check relationship, thereby improving the decoding performance.

For example, the check encoding is CRC check coding, N=512, and K1=256. A CRC generator polynomial is: $g(x)=x^8+x^2+x+1=[1\ 0\ 0\ 0\ 0\ 1\ 1\ 1]$. It can be learned from this that after the CRC encoding is performed on the K1 first information bits, 8 CRC check bits are added, and the 8 CRC check bits are a remainder obtained by dividing a sequence of the K1 first information bits by the corresponding CRC generator polynomial and are expressed as $[p_1, p_2, p_3, p_4, p_5, p_6, p_7, p_8]$. That is, the K information bits to be encoded include 256 first information bits and 8 CRC check bits, and K=256+8=264. To determine the first bit sequence, 256+8=264 bit positions need to be selected from the N bit positions as information bit positions, and the information bit positions include CRC check bit positions.

When the polar code encoding method provided in this embodiment of this application is applied to an RM-polar code, the codeword may be referred to as a transformed RM-polar (T-RM-Polar) code. When the polar code encoding method provided in this embodiment of this application is applied to a polar code, the codeword may be referred to as a transformed polar (transformed Polar, T-Polar) code.

Figure 5:
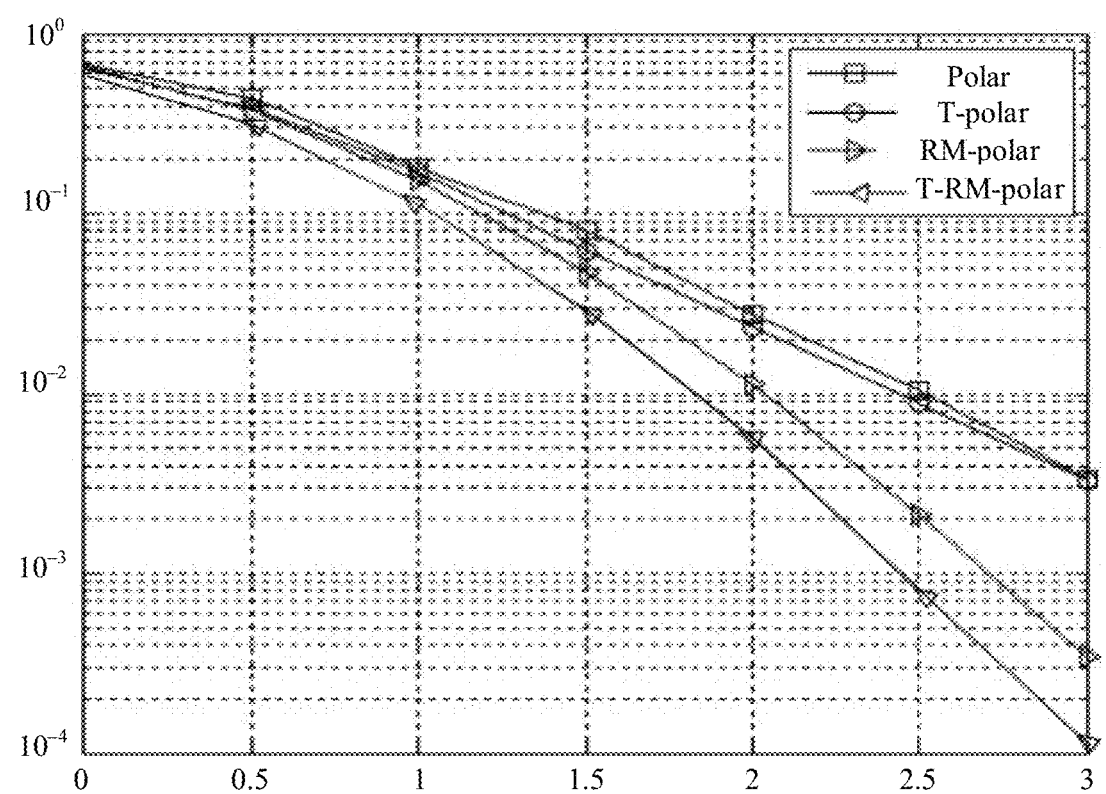
FIG. 5 is a first schematic diagram of codeword performance comparison according to an embodiment of this application.
Figure 6:
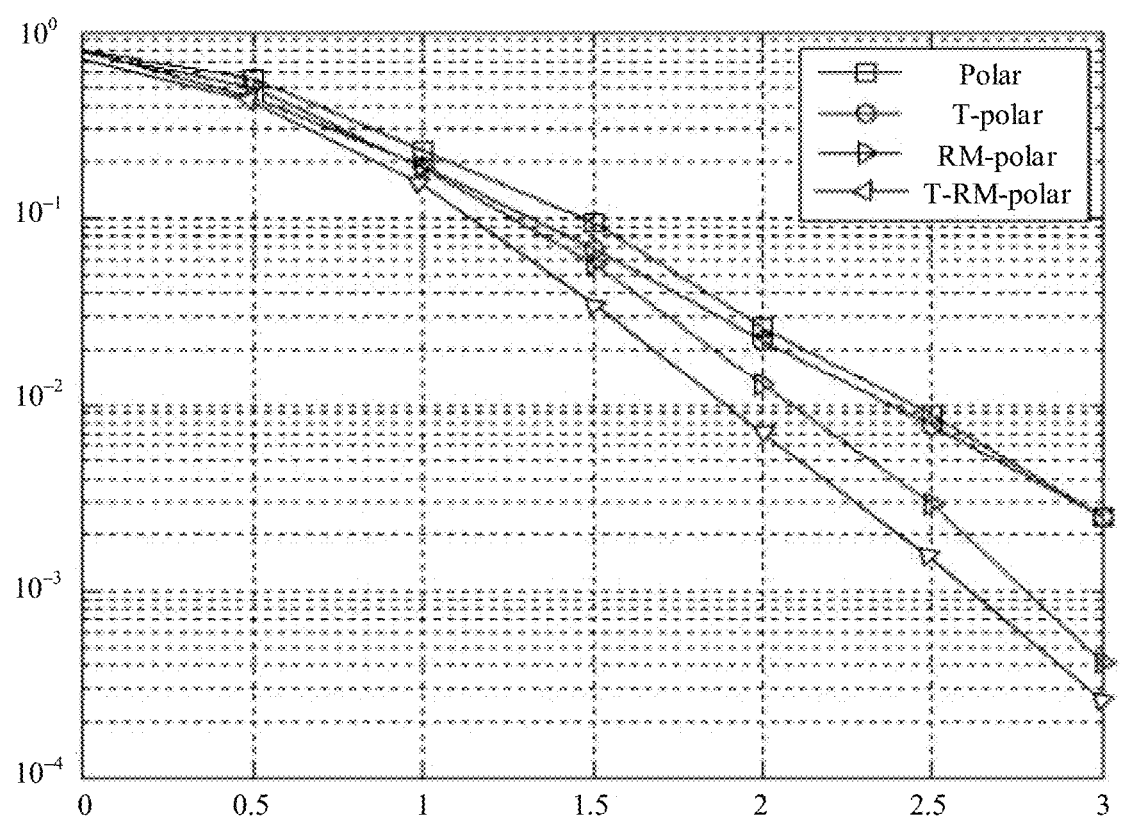
FIG. 6 is a second schematic diagram of codeword performance comparison according to an embodiment of this application.
Figure 7:
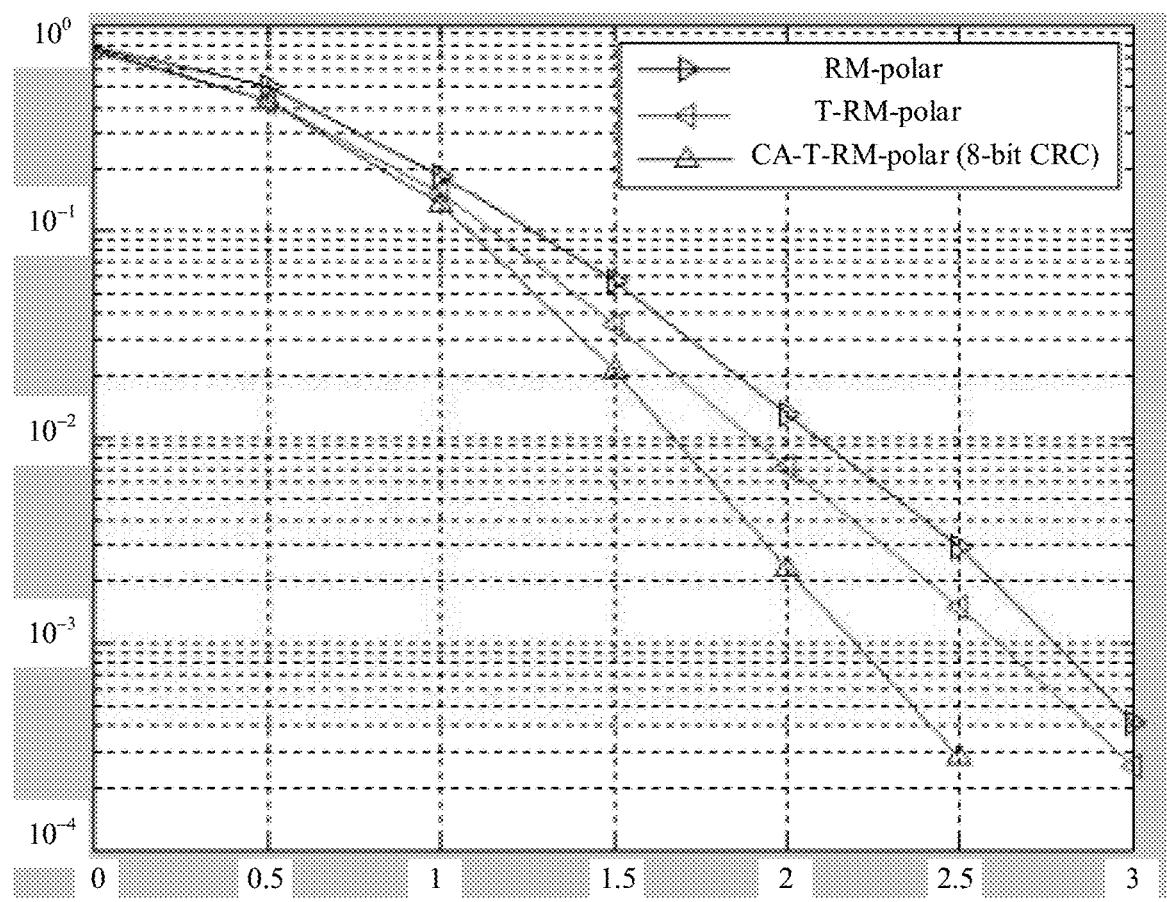
FIG. 7 is a third schematic diagram of codeword performance comparison according to an embodiment of this application.

FIG. 5 to FIG. 7 provide examples of simulation diagrams of performance comparison of several codewords below. These simulation diagrams are example diagrams representing performance gains, and the method in this embodiment of this application is not limited to decoders and parameters used in these examples. In practical applications, a codeword having a better performance gain may be obtained by using the method provided in this embodiment of this application.

FIG. 5 is a simulation diagram of performance comparison of several codewords, including a conventional polar code constructed according to the encoding method 1, a T-polar code, an RM-polar code constructed according to the encoding method 3, and a T-RM-polar code. N=256, and K=128. The horizontal axis represents a signal-to-noise ratio (Eb/No), and the vertical axis represents a frame error rate (FER). A decoder with a successive cancellation list (SCL) algorithm and a list size=32 is used for decoding.

As can be seen from FIG. 5, with the parameter settings of code length N=256 and code rate R=1/2, the T-RM-polar code has a 0.3 dB performance gain compared with the RM-polar code constructed according to the encoding method 3.

In the construction of RM-polar codes, the reliability of the polarized channels and the row weights of the generator matrix are comprehensively considered, which brings a further gain. As can be seen from FIG. 5, the T-RM-polar code has a 0.8 dB performance gain compared with T-polar code.

As can be seen from FIG. 5, the T-RM-polar code brings a nearly 1 dB gain compared with the polar code constructed according to the encoding method 1, effectively improving the performance of the polar code with the limited code length.

FIG. 6 shows performance comparison of several codewords, including a conventional polar code constructed according to the encoding method 1, a T-polar code, an RM-polar code constructed according to the encoding method 3, and a T-RM-polar code. N=512, and K=256. The horizontal axis represents a signal-to-noise ratio, and the vertical axis represents a frame error rate.

As can be seen from FIG. 6, with the parameter settings of code length N=512 and code rate R=1/2, the T-RM-polar code has a 0.2 dB performance gain compared with the RM-polar code constructed according to the encoding method 3.

In the construction of RM-polar codes, the reliability of the polarized channels and the row weights of the generator matrix are comprehensively considered, which brings a further gain. As can be seen from FIG. 6, the T-RM-polar code has a 0.5 dB performance gain compared with T-polar code.

As can be seen from FIG. 6, the T-RM-polar code brings a nearly 0.6 dB gain compared with the polar code constructed according to the encoding method 1, effectively improving the performance of the polar code with the limited code length.

FIG. 7 shows performance comparison of several codewords, including an RM-polar code constructed according to the encoding method 3, a codeword T-RM-polar code constructed according to the upper triangular matrix provided in this embodiment of this application, and a codeword constructed according to the upper triangular matrix and with information bits including check bits, which is denoted as a CRC-aided transformed RM-polar (CA-T-RM-Polar) code. N=512, and K=256. The horizontal axis represents a signal-to-noise ratio, and the vertical axis represents a frame error rate.

As can be seen from FIG. 7, with the parameter settings of code length N=512 and an 8-bit CRC check, the CA-T-RM-polar code has a 0.4 dB performance gain compared with the T-RM-polar code constructed by using the upper triangular matrix for information bits without a CRC check. Compared with the RM-polar code constructed according to the encoding method 3, the T-RM-polar code has a 0.6 dB performance gain, which is closer to the performance limit with the limited code length.

Figure 8:
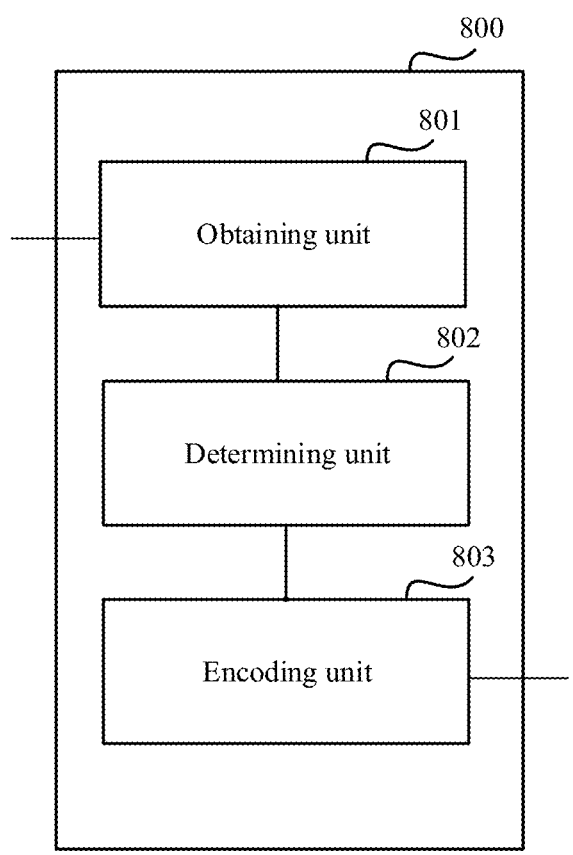
FIG. 8 is a first schematic diagram of a structure of a polar code encoding apparatus according to an embodiment of this application.

Based on the foregoing description, as shown in FIG. 8, an embodiment of this application further provides a polar code encoding apparatus 800. The polar code encoding apparatus 800 is configured to perform the foregoing polar code encoding method. The polar code encoding apparatus 800 includes:

an obtaining unit 801, configured to obtain K information bits to be encoded, where K is a positive integer;

a determining unit 802, configured to determine a first bit sequence based on the K information bits to be encoded, where a length of the first bit sequence is N, N is a positive integer power of 2, and the first bit sequence includes fixed bits and the K information bits to be encoded; and an encoding unit 803 is configured to determine a second bit sequence based on the first bit sequence and an upper triangular matrix, where the upper triangular matrix is a matrix having N rows and N columns; and configured to perform polar code encoding on the second bit sequence to obtain and output an encoded sequence.

The upper triangular matrix is an upper triangular Toeplitz matrix.

Optionally, the determining unit 802 is configured to: determine K information bit positions based on reliability sorting of N polarized channels for a polar code and a weight of each row in N rows of a generator matrix for the polar code, where the generator matrix for the polar code is a matrix having N rows and N columns, the N rows of the generator matrix for the polar code are in a one-to-one correspondence with N bit positions of the first bit sequence, and the N polarized channels are in a one-to-one correspondence with the N bit positions of the first bit sequence; and map the K information bits to be encoded to the K information bit positions, to obtain the first bit sequence.

Optionally, the determining unit 802 is configured to: select bit positions corresponding to polarized channels having highest reliability when sorted in descending order and rows of the generator matrix for the polar code having weights not less than a first threshold, as the K information bit positions.

Optionally, the determining unit 802 is configured to: select bit positions corresponding to rows of the generator matrix for the polar code having largest weights when sorted in descending order and polarized channels having reliability not less than a second threshold in the reliability sorting of the polarized channels, as the K information bit positions.

Optionally, the determining unit 802 is configured to: determine the K information bit positions based on reliability sorting of the N polarized channels for the polar code with a polarized channel related to rate matching removed and based on a weight of each row in the N rows of the generator matrix for the polar code with a row related to rate matching removed. Optionally, the polarized channel related to rate matching includes a punctured, shortened, or pre-frozen polarized channel, and the row related to rate matching includes a row corresponding to the punctured, shortened, or pre-frozen polarized channel.

Optionally, the determining unit 802 is configured to: determine K information bit positions according to the descending order of reliability of N polarized channels for a polar code, where the N polarized channels are in a one-to-one correspondence with N bit positions of the first bit sequence; and map the K information bits to be encoded to the K information bit positions, to obtain the first bit sequence.

Optionally, the determining unit 802 is configured to: determine the K information bit positions according to the descending order of reliability of the N polarized channels for the polar code with a polarized channel related to rate matching removed. Optionally, the polarized channel related to rate matching includes a punctured, shortened, or pre-frozen polarized channel.

Optionally, the determining unit 802 is configured to: determine K information bit positions based on a weight of each row in N rows of a generator matrix for a polar code, where the generator matrix for the polar code is a matrix having N rows and N columns, and the N rows of the generator matrix for the polar code are in a one-to-one correspondence with N bit positions of the first bit sequence; and map the K information bits to be encoded to the K information bit positions, to obtain the first bit sequence.

Optionally, the determining unit 802 is configured to determine the K information bit positions based on a weight of each row in the N rows of the generator matrix for the polar code with a row related to rate matching removed. Optionally, the row related to rate matching includes a row corresponding to a punctured, shortened, or pre-frozen polarized channel.

Optionally, the encoding unit 803 is configured to multiply the first bit sequence by the upper triangular matrix to obtain the second bit sequence.

Optionally, the encoding unit 803 is configured to multiply the second bit sequence by the generator matrix for the polar code to obtain the encoded sequence.

Optionally, the information bits include check bits.

Figure 9:
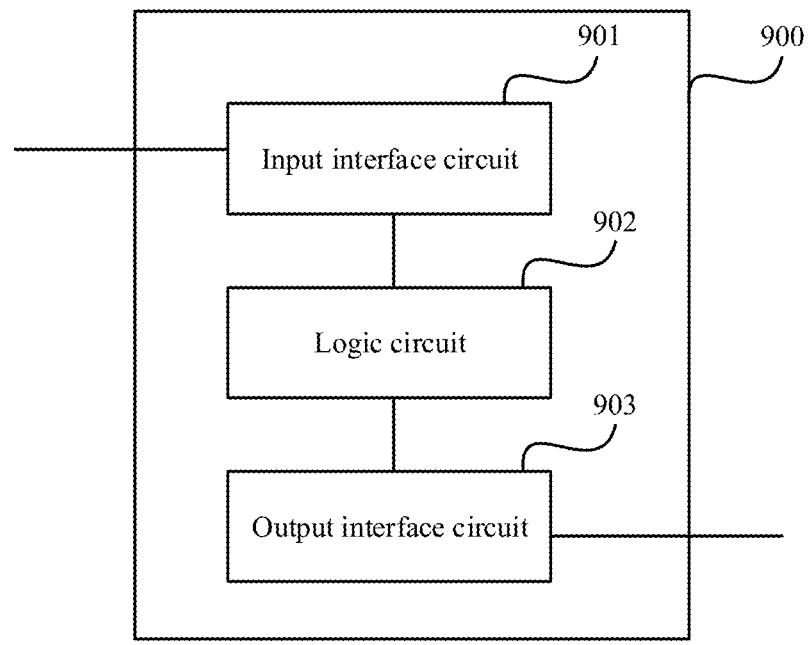
FIG. 9 is a second schematic diagram of a structure of a polar code encoding apparatus according to an embodiment of this application.

As shown in FIG. 9, an embodiment of this application further provides a polar code encoding apparatus 900. The polar code encoding apparatus 900 may be configured to perform the foregoing polar code encoding method. Part or all of the foregoing polar code encoding method may be implemented by hardware or by software. When implemented by hardware, the polar code encoding apparatus 900 includes: an input interface circuit 901, configured to obtain K information bits to be encoded; a logic circuit 902, configured to perform other operations than obtaining the bits to be encoded and outputting the encoded bits in the foregoing polar code encoding method (for details, refer to the description in the foregoing method embodiment, which is not repeated herein); and an output interface circuit 903, configured to output an encoded sequence.

Optionally, the polar code encoding apparatus 900 may be a chip or an integrated circuit in a specific implementation.

Figure 10:
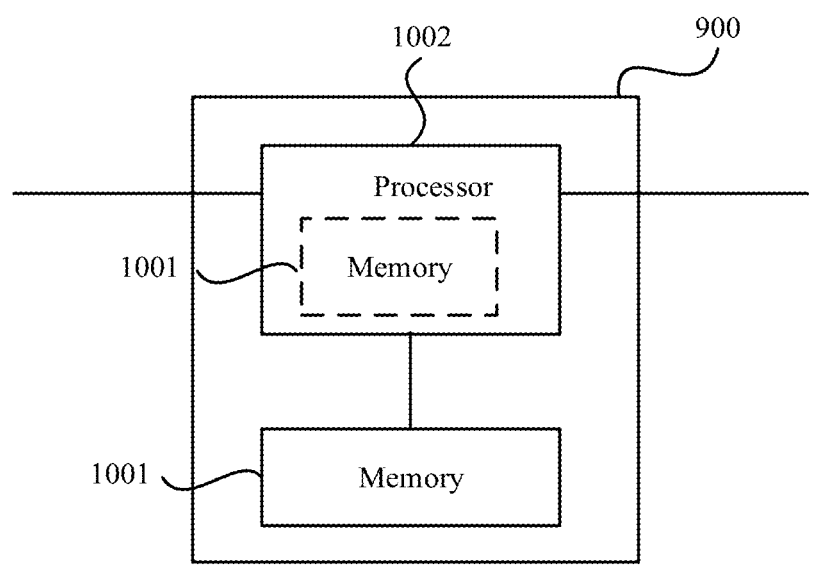
FIG. 10 is a third schematic diagram of a structure of a polar code encoding apparatus according to an embodiment of this application.

Optionally, when part or all of the polar code encoding method in the foregoing embodiment is implemented by software, as shown in FIG. 10, the polar code encoding apparatus 900 includes: a memory 1001, configured to store a program; and a processor 1002, configured to execute the program stored in the memory 1001, where the program, when executed, causes the polar code encoding apparatus 900 to perform the polar code encoding method provided in the foregoing embodiment.

Optionally, the memory 1001 may be a physically independent unit, or the memory 1001 and the processor 1002 may be integrated together.

Optionally, when part or all of the foregoing polar code encoding method is implemented by software, the polar code encoding apparatus 900 may also include only the processor 1002. The memory 1001 configured to store the program is located outside the polar code encoding apparatus 900. The processor 1002 is connected to the memory 1001 via a circuit/wire, and is configured to read and execute the program stored in the memory 1001.

The processor 1002 may be a central processing unit (CPU), a network processor (NP), or a combination of the CPU and the NP.

The processor 1002 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), generic array logic (GAL), or any combination thereof.

The memory 1001 may include a volatile memory, for example, a random access memory (RAM). The memory 1001 may alternatively include a non-volatile memory, for example, a flash memory, a hard disk drive (HDD), or a solid-state drive (SSD). The memory 1001 may alternatively include a combination of the foregoing types of memories.

The polar code encoding apparatus 900 may also be a chip, an integrated circuit, or a chip system.

An embodiment of this application may further provide a chip, including a processor for supporting the polar code encoding apparatus 900 in implementing the functions in the foregoing method embodiment. In a possible design, the chip is connected to a memory, or the chip includes a memory, where the memory is configured to store program instructions and data necessary for the polar code encoding apparatus 900.

An embodiment of this application provides a computer storage medium that stores a computer program. The computer program includes instructions for performing the foregoing method embodiment.

An embodiment of this application provides a computer program product including instructions that, when executed on a computer, cause the computer to perform the foregoing method embodiment.

Persons skilled in the art should understand that embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer-readable memory that can instruct the computer or any other programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some embodiments of this application have been described, persons skilled in the art can make changes and modifications to these embodiments once they learn the basic inventive concept. Therefore, the following claims are intended to be construed as to cover the preferred embodiments and all changes and modifications falling within the scope of this application.

Obviously, persons skilled in the art can make various modifications and variations to embodiments of this application without departing from the scope of embodiments of this application. This application is intended to cover these modifications and variations provided that they fall within the scope of protection defined by the following claims and their equivalent technologies.

What is claimed is:

1. A polar code encoding method implemented by a polar code encoding apparatus, comprising:
    obtaining, by an input interface circuit of the polar code encoding apparatus, K information bits to be encoded, wherein K is a positive integer;
    determining, by a processor of the polar code encoding apparatus, K information bit positions;
    mapping, by the processor of the polar code encoding apparatus, the K information bits to be encoded to the K information bit positions to obtain a first bit sequence, wherein a length of the first bit sequence is N, N is a positive integer power of 2, and the first bit sequence comprises fixed bits and the K information bits to be encoded;
    determining, by the processor of the polar code encoding apparatus, a second bit sequence based on the first bit sequence and an upper triangular matrix, wherein the upper triangular matrix is a matrix having N rows and N columns;
    performing, by the processor of the polar code encoding apparatus, polar code encoding on the second bit sequence to obtain an encoded sequence; and
    transmitting, by the output interface circuit of the polar code encoding apparatus, the encoded sequence to a device to be decoded.

2. The method according to claim 1, wherein the upper triangular matrix is an upper triangular Toeplitz matrix.

3. The method according to claim 1, wherein the K information bit positions is determined based on reliability sorting of N polarized channels for a polar code and a weight of each row in N rows of a generator matrix for the polar code, wherein the generator matrix for the polar code is a matrix having N rows and N columns, the N rows of the generator matrix for the polar code are in a one-to-one correspondence with N bit positions of the first bit sequence, and the N polarized channels are in a one-to-one correspondence with the N bit positions of the first bit sequence.

4. The method according to claim 3, wherein the K information bit positions is determined by
    selecting bit positions corresponding to polarized channels having highest reliability when sorted in descending order and rows of the generator matrix for the polar code having weights not less than a first threshold, as the K information bit positions.

5. The method according to claim 3, wherein the K information bit positions is determined by
    selecting bit positions corresponding to rows of the generator matrix for the polar code having largest weights when sorted in descending order and polarized channels having reliability not less than a second threshold in the reliability sorting of the polarized channels, as the K information bit positions.

6. The method according to claim 3, wherein the K information bit positions is determined based on reliability sorting of the N polarized channels for the polar code with a polarized channel related to rate matching removed and based on a weight of each row in the N rows of the generator matrix for the polar code with a row related to rate matching removed, wherein the polarized channel related to rate matching comprises a punctured, shortened, or pre-frozen polarized channel, and the row related to rate matching comprises a row corresponding to the punctured, shortened, or pre-frozen polarized channel.

7. The method according to claim 1, wherein the K information bit positions is determined according to the descending order of reliability of N polarized channels for a polar code, wherein the N polarized channels are in a one-to-one correspondence with N bit positions of the first bit sequence.

8. The method according to claim 1, wherein the K information bit positions is determined based on a weight of each row in N rows of a generator matrix for a polar code, wherein the generator matrix for the polar code is a matrix having N rows and N columns, and the N rows of the generator matrix for the polar code are in a one-to-one correspondence with N bit positions of the first bit sequence.

9. The method according to claim 1, wherein the determining a second bit sequence based on the first bit sequence and an upper triangular matrix comprises:
    multiplying the first bit sequence by the upper triangular matrix to obtain the second bit sequence.

10. The method according to claim 1, wherein the performing polar code encoding on the second bit sequence to obtain an encoded sequence comprises:
    multiplying the second bit sequence by the generator matrix for the polar code to obtain the encoded sequence.

11. A polar code encoding apparatus, comprising:
    at least one processor; and
    at least one non-transitory memory coupled to the at least one processor and storing program instructions, wherein the at least one processor is configured to execute the program instructions to cause the polar code encoding apparatus to:
    obtain K information bits to be encoded, wherein K is a positive integer;
    determine K information bit positions;
    map the K information bits to be encoded to the K information bit positions to obtain a first bit sequence, wherein a length of the first bit sequence is N, N is a positive integer power of 2, and the first bit sequence comprises fixed bits and the K information bits to be encoded;
    determine a second bit sequence based on the first bit sequence and an upper triangular matrix, wherein the upper triangular matrix is a matrix having N rows and N columns; perform polar code encoding on the second bit sequence to obtain an encoded sequence; and
    transmit the encoded sequence to a device to be decoded.

12. The apparatus according to claim 11, wherein the upper triangular matrix is an upper triangular Toeplitz matrix.

13. The apparatus according to claim 11, wherein the at least one processor is further configured to execute the program instructions to cause the polar code encoding apparatus to:
    determine the K information bit positions based on reliability sorting of N polarized channels for a polar code and a weight of each row in N rows of a generator matrix for the polar code, wherein the generator matrix for the polar code is a matrix having N rows and N columns, the N rows of the generator matrix for the polar code are in a one-to-one correspondence with N bit positions of the first bit sequence, and the N polarized channels are in a one-to-one correspondence with the N bit positions of the first bit sequence.

14. The apparatus according to claim 13, wherein the at least one processor is further configured to execute the program instructions to cause the polar code encoding apparatus to:

select bit positions corresponding to polarized channels having highest reliability when sorted in descending order and rows of the generator matrix for the polar code having weights not less than a first threshold, as the K information bit positions.

15. The apparatus according to claim 13, wherein the at least one processor is further configured to execute the program instructions to cause the polar code encoding apparatus to:
select bit positions corresponding to rows of the generator matrix for the polar code having largest weights when sorted in descending order and polarized channels having reliability not less than a second threshold in the reliability sorting of the polarized channels, as the K information bit positions.

16. The apparatus according to claim 11, wherein the at least one processor is further configured to execute the program instructions to cause the polar code encoding apparatus to:
determine the K information bit positions based on reliability sorting of the N polarized channels for the polar code with a polarized channel related to rate matching removed and based on a weight of each row in the N rows of the generator matrix for the polar code with a row related to rate matching removed, wherein the polarized channel related to rate matching comprises a punctured, shortened, or pre-frozen polarized channel, and the row related to rate matching comprises a row corresponding to the punctured, shortened, or pre-frozen polarized channel.

17. The apparatus according to claim 11, wherein the at least one processor is further configured to execute the program instructions to cause the polar code encoding apparatus to:
determine the K information bit positions according to the descending order of reliability of N polarized channels for a polar code, wherein the N polarized channels are in a one-to-one correspondence with N bit positions of the first bit sequence.

18. The apparatus according to claim 11, wherein the at least one processor is further configured to execute the program instructions to cause the polar code encoding apparatus to:
determine the K information bit positions based on a weight of each row in N rows of a generator matrix for a polar code, wherein the generator matrix for the polar code is a matrix having N rows and N columns, and the N rows of the generator matrix for the polar code are in a one-to-one correspondence with N bit positions of the first bit sequence.

19. The apparatus according to claim 11, wherein the apparatus is a chip or an integrated circuit.

20. A non-transitory computer-readable storage medium storing computer-readable instructions that, when executed by a polar code encoding apparatus, cause the polar code encoding apparatus to:
obtain K information bits to be encoded, wherein K is a positive integer;
determine K information bit positions;
map the K information bits to be encoded to the K information bit positions to obtain a first bit sequence, wherein a length of the first bit sequence is N, N is a positive integer power of 2, and the first bit sequence comprises fixed bits and the K information bits to be encoded;
determine a second bit sequence based on the first bit sequence and an upper triangular matrix, wherein the upper triangular matrix is a matrix having N rows and N columns; and perform polar code encoding on the second bit sequence to obtain an encoded sequence; and
transmit the encoded sequence to a device to be decoded.

* * * * *